US006614220B2

United States Patent
Mang et al.

(10) Patent No.: US 6,614,220 B2
(45) Date of Patent: Sep. 2, 2003

(54) METHOD AND DEVICE FOR AUTOMATIC ADJUSTMENT OF PRINTED CIRCUIT BOARD CONVEYING MEANS IN A TEST MACHINE

(75) Inventors: Paul Mang, Taunusstein Bleidenstadt (DE); Graziano Bagioni, Verona (IT); Gert Wetzel, Oberursel (DE); Giovanni Pavoni, Pescantina (IT); Gianpaolo Antonello, Verona (IT)

(73) Assignee: Mania Tecnologie Italia SpA, Verona (IT)

( * ) Notice: Subject to any disclaimer, the term of this patent is extended or adjusted under 35 U.S.C. 154(b) by 0 days.

(21) Appl. No.: 09/966,069

(22) Filed: Oct. 1, 2001

(65) Prior Publication Data

US 2002/0047703 A1 Apr. 25, 2002

(30) Foreign Application Priority Data

Oct. 19, 2000 (IT) .................... MI2000A2267

(51) Int. Cl.[7] ............................................. G01R 31/02
(52) U.S. Cl. .................... 324/158.1; 324/765
(58) Field of Search .............. 324/758, 158.1; 198/414; 101/114, 723; 118/213

(56) References Cited

U.S. PATENT DOCUMENTS

| 5,009,306 | A | * | 4/1991 | Roderick et al. | ............ 198/414 |
| 5,873,939 | A | * | 2/1999 | Doyle et al. | ................ 118/213 |
| 6,374,729 | B1 | * | 4/2002 | Doyle | ......................... 101/114 |

* cited by examiner

Primary Examiner—Kamand Cuneo
Assistant Examiner—Jimmy Nguyen
(74) Attorney, Agent, or Firm—Nixon & Vanderhye, P.C.; Frank P. Presta

(57) ABSTRACT

A testing method and machine for automatic adjustment of the conveying means for printed circuit boards (20) in a test machine of modular type, comprising a test module (1), a loading module (2), and an unloading module (3), wherein respective moveable rails (110, 111; 210, 211; 310, 311) are provided to support the rails (110, 111) are moved toward each other, with an independent movement, and temporarily stopped on detection of corresponding stops (26) indicative of the width of the printed circuit board (20) to be tested, then withdrawn by a fixed, pre-established distance, so as to be disposed in the correct conveying position, the rails (210, 211; 310, 311) of the other modules (2, 3) being brought toward each other and stopped on detection of fixed stops in the test module (1), so as to be disposed in perfect alignment with the rails (110, 111).

10 Claims, 3 Drawing Sheets

METHOD AND DEVICE FOR AUTOMATIC ADJUSTMENT OF PRINTED CIRCUIT BOARD CONVEYING MEANS IN A TEST MACHINE

BACKGROUND OF THE INVENTION

1. Field of the Invention

The present invention relates to a method and a device for automatic adjustment of the conveying means, normally a belt conveyor, for printed circuits in a machine for performing the electrical test.

2. Description of Related Art

As is known, electrical testing of an unassembled printed circuit consists in checking that all the nets present on the printed circuit board are insulated form one another and that there is electrical continuity between the points of each net. For this purpose special machines are used which, by means of suitable electrical contact grids, with interposed interfacing devices (adaptors or fixtures) establish connections with well-defined points of the printed circuit that is loaded on the machine.

Automation of testing of unassembled printed circuits is made difficult mainly because of the considerable differences in the items to be handled, which require a laborious initial calibration at the start of each work cycle with batches of different circuits.

Automation of the electrical test on printed circuits is achieved mainly by using a belt conveyor, comprising side belts that support the printed circuit on both sides, and transfer it from the loading area to the test area, and subsequently to the unloading area, disposed on the same number of machine modules.

The conveyor belts are carried on mobile rails that can be adjusted to the width of the printed circuit board to be tested. The better this adjustment, the better the machine will work.

This adjustment can currently be carried out either manually or from a keyboard.

Manual adjustment is done by means of mechanical devices, which allow the two side rails to be moved manually on guides, or by use of a flywheel, and locked in position according to the width of the printed circuit.

Adjustment through keyboard control is done by entering the data concerning the exact width of the printed circuit, data which is transferred to motors, which, by rotating screws for example, move the rails sideward on guides to place them in the correct position according to the width of the printed circuit to be tested.

In both cases this adjustment requires the intervention of the operator, and thus is subject to the risk of human error.

Moreover, said adjustment is somewhat complex and not absolutely precise.

SUMMARY OF THE INVENTION

The object of the invention is to eliminate the aforementioned drawbacks and increase the precision and adjustment of the distance between the rails supporting the side conveyor belts in a circuit board test machine.

According to the invention, adjustment of the rails takes place completely automatically.

Essentially, micro switches are disposed on the rails and act as sensors, which, following the independent movements of the respective rails, detect the position of abutments or fixed stops indicative of the width of the printed circuit to be tested, establishing the stopping position of the rails.

The adjustment is advantageously carried out in the test area of the machine, level with the bottom fixture, and said abutments or fixed stops are advantageously the side edges of the top plate of the fixture. Alternatively, said fixed stops can be the side edges of any other plate of the fixture, or of said printed circuit to be tested.

In practice, after having disposed the fixture suitable for testing the particular printed circuit in the test area, the two rails are spaced at the maximum distance and subsequently brought together so as to detect said fixed stops, something which normally happens at different moments, the moments when the rails stop in said positions to be subsequently moved apart by a pre-established fixed length, so as to be disposed at the optimal distance for conveying the printed circuit to be tested.

Since the machine is built in modules, the rails of the other modules (loading station, unloading, etc.), which are provided with special sensors that detect the exact position of the already adjusted adjacent rails, are subsequently adjusted.

BRIEF DESCRIPTION OF THE DRAWINGS

Further characteristics of the invention will be made clearer by the detailed description that follows, referring to a purely exemplary and therefore non-limiting embodiment thereof, illustrated in the appended drawings, in which.

DESCRIPTION OF THE PREFERRED EMBODIMENTS

Figure 1:
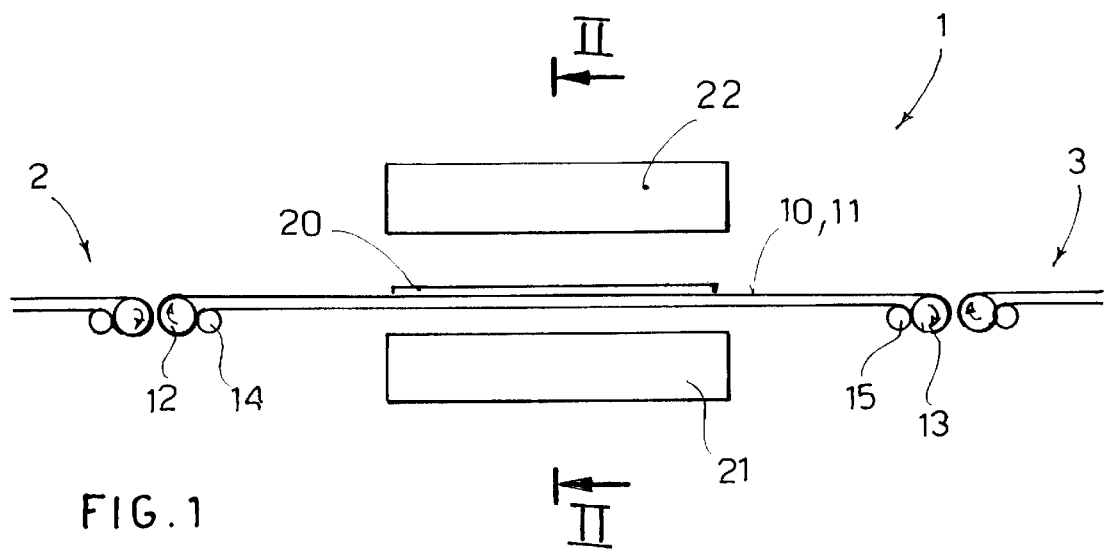
FIG. 1 is a diagrammatic side view of a machine for electrical testing of printed circuits, showing in particular the test area and partially the circuit loading and unloading areas.

FIG. 1 diagrammatically shows a machine for automatic electrical testing of printed circuits, of the modular type, comprising in particular a test or work module or station 1, where the electrical test on the circuit is performed, a loading module or station 2, able to transfer the circuits into the test module 1, and an unloading module or station 3 for evacuation of the circuits from the work station 1 after performance of the electrical test.

The machine geometry illustrated in FIG. 1 should be understood as purely exemplary, it being obvious that other geometries are possible, in particular other modules or stations for performance of other processes on the circuits can be provided.

The circuits are moved between the various modules by means of endless belt conveyors, carried on mobile rails and destined to support the printed circuit directly, or carriers on which the printed circuits are disposed.

Figure 2:
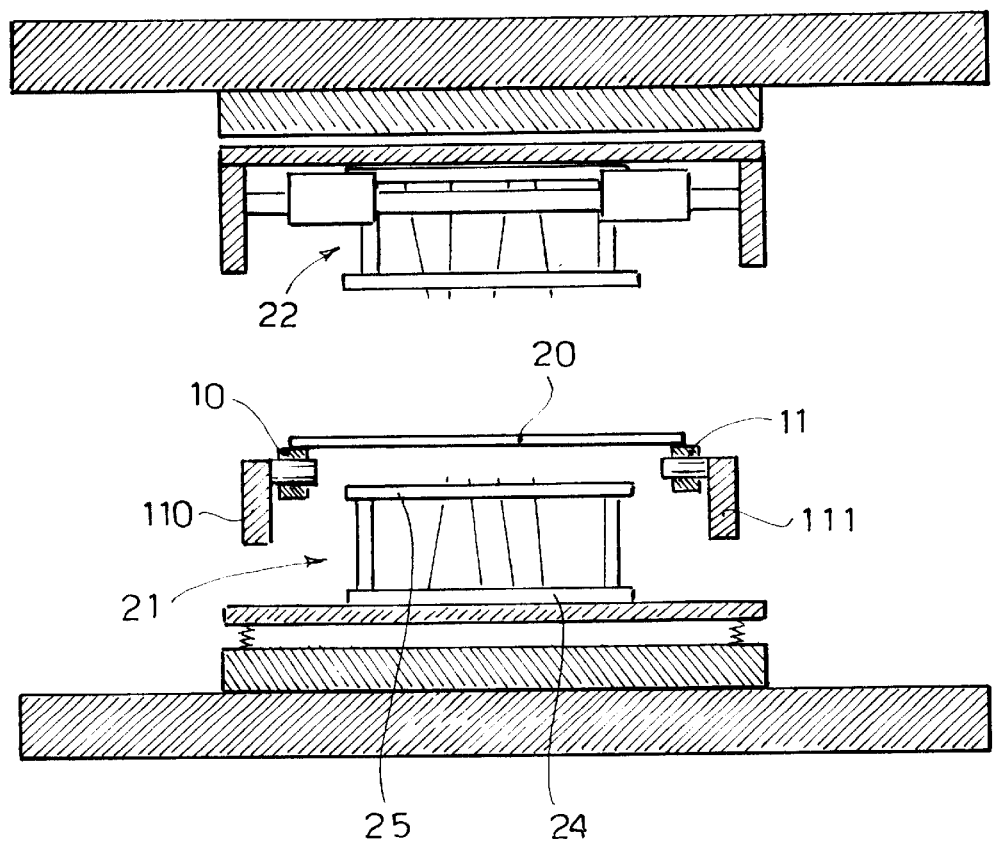
FIG. 2 is a diagrammatic enlarged cross-sectional view, taken in the test area of the machine, for example along the plane II—II of FIG. 1.

FIGS. 1 and 2 diagrammatically show two side belts, denoted by reference numerals 10 and 11, for positioning of the printed circuit, denoted by 20, in the test area.

Each belt 10, 11, winds around respective end pulleys 12, 13 (FIG. 1), at least one of which is a drive pulley, and is tensioned by appropriate counter rollers 14, 15.

As shown diagrammatically in FIG. 2, each belt 10, 11 is carried by a respective transversally moveable rail 110, 111, so as to be able to adapt to the width of the circuit to be tested, as will now be better described.

FIG. 2 illustrates the test area of the machine, in which the electrical test is performed on the printed circuit, which consists in checking that all the nets present thereon are insulated from each other and that there is electrical continuity between the points of each net. This is carried out by means of electrical contacts with well-defined points of the circuit, and to do this special bottom 21 and top 22 adaptors or fixtures are used, to perform the test respectively on the bottom surface and on the top surface of the printed circuit 20.

The fixtures are to be considered per se known, and therefore they will not be further described in detail. For further explanation reference should be made, for example, to EP-A-651 260.

Here it will be specified only that each fixture has a plurality of pin contacts and a series of parallel plates for passage of said pins. In FIG. 2 an intermediate plate and a top plate of the bottom fixture 21 are designated respectively as 24 and 25.

For the test to be performed correctly, the printed circuit 20 must be positioned in a very precise position between the fixtures 21, 22, whose shape is related to the printed circuit to be tested.

To achieve this, besides providing stop means, which will not be described in detail inasmuch as they do not form the subject matter of the invention, the printed circuits 20 must be conveyed very precisely, and to do so the distance between the rails 110, 111 must be adjusted to adapt it to the width of the particular circuit.

Automatic adjustment of the rails 110, 111 according to the invention will now be described with reference to FIGS. 3 to 7 which illustrate the sequence of stages during adjustment, in diagrammatic views from above.

In these figures adjustment is performed taking as the reference the top plate 25 of the bottom fixture 21, the side edges 26 of which have been milled with a numerical control machine, so as to ensure high precision.

It is nevertheless obvious that another element can be taken as the reference for adjustment, for example another plate of the bottom fixture 21, a plate of the top fixture 22, the printed circuit 20 to be tested, or external elements suitably worked and applied to the fixture.

Returning to FIGS. 3 to 7, adjustment of the rails 110, 111 which carry the conveyor belts 10, 11 will now be described.

Figure 3:
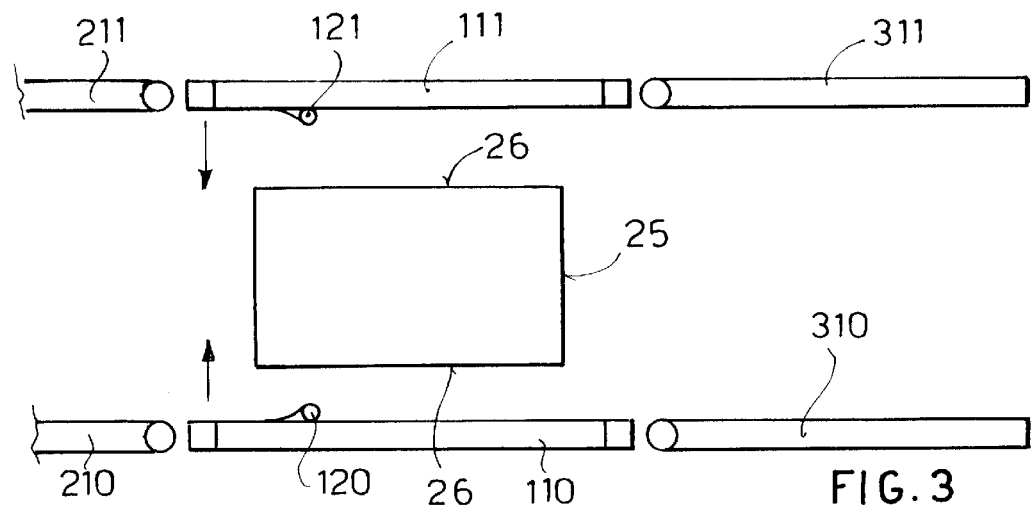
FIGS. 3 to 7 are diagrammatic plan views of the test machine of FIG. 1, showing successive stages of adjustment thereof to a particular circuit to be tested.

Once the fixtures have been positioned on the basis of the circuit to be tested, the two rails 110, 111 are brought into a maximum spacing position, as shown in FIG. 3, for example. The rails 110, 111, each bearing a respective micro switch 120, 121, acting as a sensor, are subsequently brought together, moving in the direction of the arrows shown in FIG. 3. These movements take place with per se known methods, for example with a screw-nut screw, which will not be further described.

Figure 4:
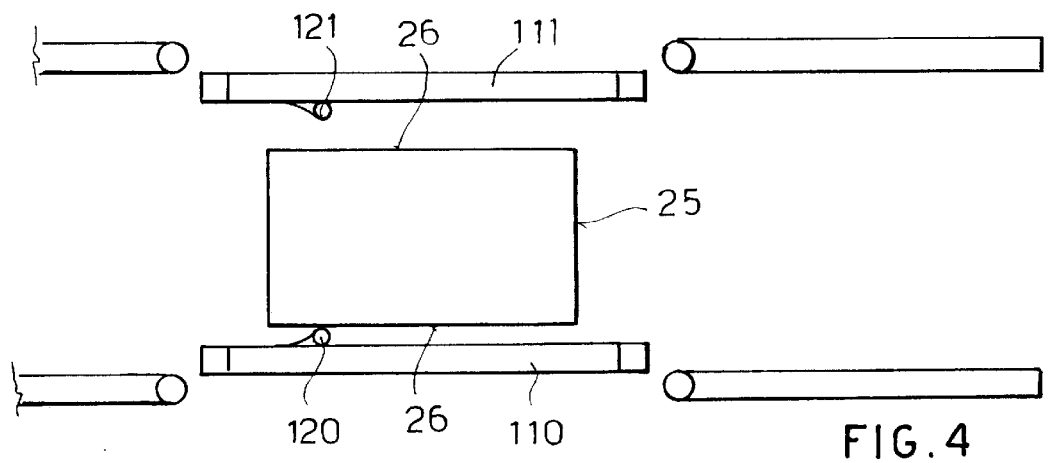
Figure 5:
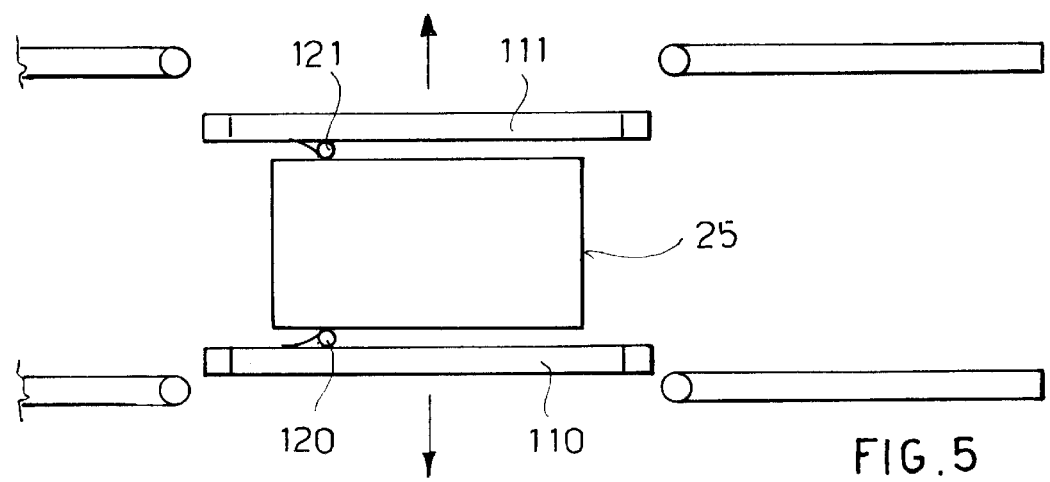

When the micro switch of one of the two rails touches the corresponding side edge 26 of the top plate 25 of the fixture, in FIG. 4 the micro switch 120 of the rail 110, this rail is momentarily locked in this position, while the other rail 111 continues its movement until the corresponding micro switch 121 comes into contact with side edge 26 of the plate 25, also stopping (FIG. 5).

Figure 6:
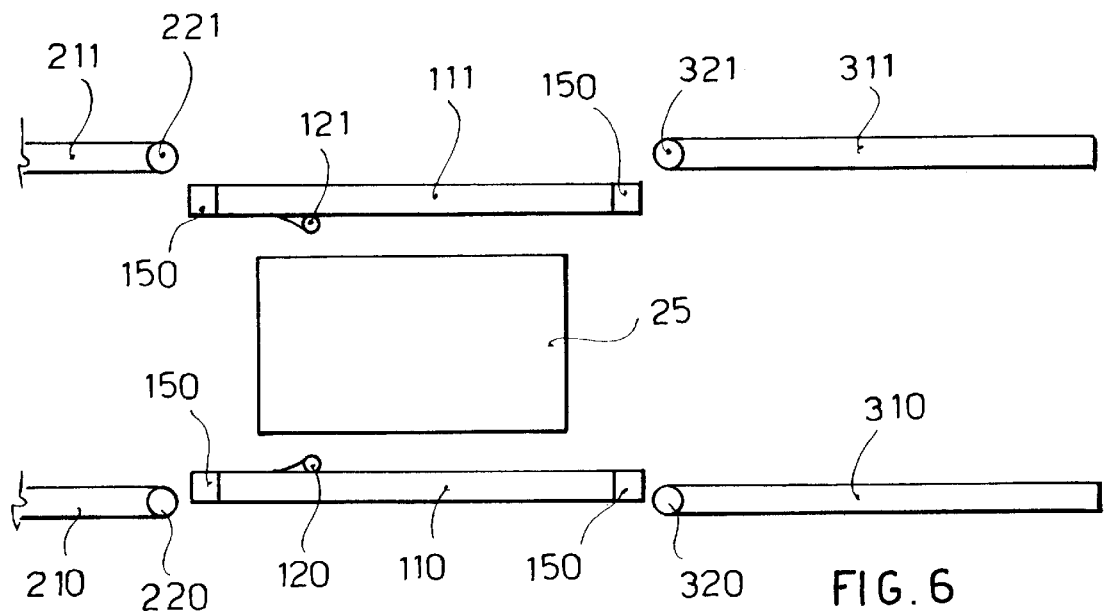

At this point, both rails are moved away from the plate 25, as shown by the arrows in FIG. 5, by a pre-established distance, to be disposed in the correct position for conveying the printed circuit 20 (FIG. 6).

Once setting of the test module 1 has been performed as described previously, the position of the rails of the other modules is adjusted, and in particular the rails of the loading module 2 and of the unloading module 3, designated respectively by 210, 211 and 310, 311.

Figure 7:
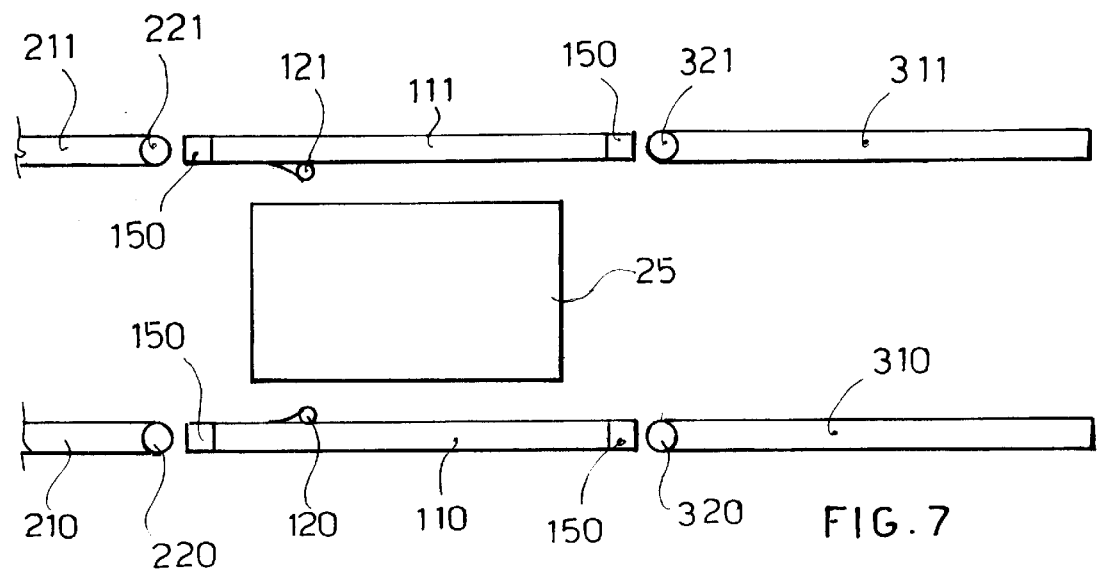

Each rail is provided, at the end facing toward the test module 1, with a respective sensor 220, 221, 320, 321, in the form, for example, of an inductive switch which detects the position of a corresponding metal part, for example a steel cube 150 disposed at each end of the rails 110, 111 (see in particular FIGS. 6 and 7).

In this manner, the rails 210, 211, 310, 311, operated independently of one another, in the direction of drawing together, stop when the respective sensors 220, 221, 320, 321 come into register with the respective steel cube 150, as shown in FIG. 7.

If there are other modules present these are adjusted in the same manner, according to the position of the adjacent modules.

From what has been described the advantages of the invention are evident, in that it proposes a device and a method for completely automatic adjustment of the conveyor means for printed circuits in a testing machine, which minimizes the setting time for said means, eliminating the risk of human error.

Obviously the invention is not limited to the particular embodiment previously described and illustrated in the appended drawings, but numerous modifications of detail known to a person skilled in the art can be made thereunto without departing from the scope of the invention, defined by the appended claims.

What is claimed is:

1. A test machine comprising a device for adjusting the conveying means for a printed circuit board to be tested, on the basis of the width of a printed circuit board (20), said conveying means being supported by parallel rails (110, 111) disposed in a test module or station (1) of the machine and being moveable toward and away from each other, characterized in that associated with said rails (110, 111) are respective sensors (120, 121) able to detect corresponding stops indicating the width of the printed circuit board (20) to be tested and control positioning of said rails (110, 111) in the correct position for conveying the circuit board (20); and wherein further pairs of rails (210, 211; 310, 311) are provided for conveying the printed circuit board (20) to other stations of the test machine, such as a loading station or module (2) and an unloading station or module (3), characterized in that said rails are provided with respective sensors (220, 221; 320, 321) able to detect stops (150) in the test station (1) to position themselves in perfect alignment with the rails (110, 111) of the test station (1).

2. A device according to claim 1, characterized in that said stops (26) are the side edges of a plate of a fixture (21, 22) of the test machine.

3. A device according to claim 2, characterized in that said stops (26) are the side edges of the top plate (25) of the bottom fixture (21) of the test machine.

4. A device according to claim 1, characterized in that said stops (26) are the side edges of the printed circuit board (20) to be tested.

5. A device according to claim 1, characterized in that said sensors (120, 121) are micro switches.

6. A device according to claim 1, characterized in that said sensors (220, 221; 320, 321) are inductive switches and said stops (150) are steel cubes disposed at the ends of said rails (110, 111).

7. A device according to claim 1, characterized in that said means for conveying the printed circuit board (20) are belt conveyors (10, 11).

8. A machine for electrical testing of printed circuit boards (20), comprising a test station or module (1) and possibly other stations or modules (2, 3) for loading, unloading, or other operations to be carried out on the circuit boards (20), characterized in that a device is provided for automatic adjustment of the conveying means for said printed circuit boards (20) according to claim 1.

9. A method of testing printed circuit boards (20) wherein they are disposed on conveying means supported by pairs of side rails (110, 111), disposed in the test station or module of the test machine, characterized in that it comprises:
- independent operation of said rails (110, 111) in the direction of moving toward each other;
- temporary stopping of said rails (110, 111) on detection of corresponding stops (26) indicative of the width of the printed circuit board (20) to be tested;
- operation of said rails (110, 111) in the direction of moving away from each other to position them in the correct position for conveying said printed circuit board (20); and wherein further pairs of rails (210, 211; 310, 311) are provided for conveying the printed circuit board (20) to other stations of the test machine, such as a loading station (2), an unloading station (3) or other stations for carrying out other processes on the circuit boards, characterized in that provision is also made for independent operation of said rails (210, 211; 310, 311) in the direction of moving toward each other and stopping on detection of corresponding stops (150) disposed in the test module (1), so that said pairs of rails (210, 211; 310, 311) are disposed in perfect alignment with said rails (110, 111).

10. A method according to claim 9, characterized in that said stops (26) detected during the movement of said rails (110, 111) are the side edges of a plate of one of the bottom (21) or top (22) fixtures of the test machine or the side edges of the printed circuit board (20) itself, or external elements applied to the fixture (21, 22).

* * * * *